US008067091B2

(12) United States Patent
Brunovska et al.

(10) Patent No.: US 8,067,091 B2
(45) Date of Patent: Nov. 29, 2011

(54) DIMENSIONALLY STABLE, LEAK-FREE GRAPHITE SUBSTRATE

(75) Inventors: Zdenka Brunovska, Hudson, OH (US); Bradley E. Reis, Westlake, OH (US); Jeffrey J. Gough, Olmsted Township, OH (US); Lawrence K. Jones, Parma, OH (US); Thomas W. Weber, Cleveland, OH (US); David J. Stuart, North Ridgeville, OH (US); Suha M. Yazici, Istanbul (TR); Jeremy Klug, Union, KY (US); Franco Frate, Willoughby, OH (US)

(73) Assignee: GrafTech International Holdings Inc., Parma, OH (US)

( * ) Notice: Subject to any disclaimer, the term of this patent is extended or adjusted under 35 U.S.C. 154(b) by 1378 days.

(21) Appl. No.: 11/613,233

(22) Filed: Dec. 20, 2006

(65) Prior Publication Data

US 2008/0152917 A1 Jun. 26, 2008

(51) Int. Cl.
*B32B 9/00* (2006.01)

(52) U.S. Cl. ...................... 428/408; 423/447.1; 165/185

(58) Field of Classification Search .................. 428/408; 423/447.1, 445 R
See application file for complete search history.

(56) References Cited

U.S. PATENT DOCUMENTS

| | | | | |
|---|---|---|---|---|
| 3,404,061 | A | 10/1968 | Shane et al. | 161/125 |
| 4,895,713 | A | 1/1990 | Greinke et al. | 423/448 |
| 5,099,311 | A | 3/1992 | Bonde et al. | 357/82 |
| 5,099,910 | A | 3/1992 | Walpole et al. | 165/80.4 |
| 5,874,775 | A | 2/1999 | Shiomi et al. | 257/712 |
| 6,410,128 | B1 | 6/2002 | Calarco et al. | 428/313.9 |
| 6,432,336 | B1 | 8/2002 | Mercuri et al. | 264/51 |
| 6,457,515 | B1 | 10/2002 | Vafai et al. | 165/80.4 |
| 6,604,457 | B2 | 8/2003 | Klug | 101/32 |
| 6,663,807 | B2 | 12/2003 | Klug | 264/105 |
| 6,673,289 | B2 | 1/2004 | Reynolds, III et al. | 264/115 |
| 6,675,875 | B1 | 1/2004 | Vafai et al. | 165/80.4 |
| 6,716,381 | B2 | 4/2004 | Klug | 264/134 |
| 7,108,917 | B2 | 9/2006 | Klug | 428/408 |
| 2001/0046560 | A1 | 11/2001 | Fong et al. | |
| 2002/0180094 | A1 * | 12/2002 | Gough et al. | 264/127 |
| 2003/0062149 | A1 | 4/2003 | Goodson et al. | |
| 2004/0245668 | A1 | 12/2004 | Gough et al. | |
| 2005/0189673 | A1 | 9/2005 | Klug et al. | |
| 2005/0202245 | A1 * | 9/2005 | Mercuri et al. | 428/408 |

OTHER PUBLICATIONS

International Publication No. WO 02/084760, Oct. 24, 2002, PCT/US02/10397.

* cited by examiner

*Primary Examiner* — David Sample
*Assistant Examiner* — Daniel H Miller
(74) *Attorney, Agent, or Firm* — Waddey & Patterson, P.C.; James R. Cartiglia

(57) ABSTRACT

A method for preparing resin-impregnated graphite articles, including providing a sheet of compressed particles of exfoliated graphite having two major surfaces; impregnating the sheet with a first resin system to form a resin-impregnated sheet; surface treating the resin-impregnated sheet to form at least one structure on at least one of the major surfaces of the sheet to form a surface treated sheet; and treating the sheet with a second resin system.

11 Claims, No Drawings

DIMENSIONALLY STABLE, LEAK-FREE GRAPHITE SUBSTRATE

TECHNICAL FIELD

The present invention relates to a graphite substrate which is both dimensionally stable and leak-free, and which can be used in applications such as electronic thermal management and electrochemical fuel cells. The graphite substrate can have structures, such as channels or grooves formed on one or both surfaces, and exhibits properties not heretofore seen.

BACKGROUND OF THE ART

The electronics industry is entering into a heat constrained period of growth. The heat flux of electronic components is increasing and air cooling will no longer remove enough heat to maintain the desired operating temperatures of the microprocessors and other electronic components.

The maximum heat flux which is generally considered to be manageable by conventional air cooling is about 50 W/cm$^2$. As microprocessors and other electronic devices are developed which create a heat flux in excess of about 50 W/cm$^2$ the electronics industry is moving to liquid cooled heat sinks. One approach to such liquid cooled heat sinks is what is referred to as a microchannel heat sink. A microchannel heat sink has extremely small grooves formed in the material from which the heat sink is constructed so as to provide very thin fins separated by very thin microchannels. This provides a much larger surface area for the dissipation of heat. Combined with a forced liquid circulation system microchannel heat sinks provide one of the most promising solutions to the electronics industry's appetite for increased cooling capacity.

To date, microchannel heat sinks have been constructed from materials such as silicon, diamond, aluminum and copper, copper-tungsten composites, and ceramics such as beryllium oxide.

U.S. Pat. No. 5,099,311 to Bonde et al., the details of which are incorporated herein by reference, discloses a typical construction for a silicon microchannel heat sink including systems for delivery of coolant to the microchannels.

U.S. Pat. No. 5,099,910 to Walpole et al., the details of which are incorporated herein by reference, discloses a microchannel heat sink having U-shaped microchannels so that the direction of fluid flow alternates in adjacent microchannels so as to provide a more uniform temperature and thermal resistance on the surface of the heat sink. The Walpole et al. heat sinks are manufactured from silicon, a copper-tungsten composite such as Thermcon® or a ceramic such as beryllium oxide.

U.S. Pat. Nos. 6,457,515 and 6,675,875 to Vafai et al., the details of which are incorporated herein by reference, disclose multi-layer microchannel heat sinks having fluid flow in opposite directions in adjacent layers, so as to eliminate the temperature gradient in the direction of fluid flow across the heat sink.

U.S. Pat. No. 5,874,775 to Shiomi et al., the details of which are incorporated herein by reference, discloses a diamond heat sink.

U.S. Patent Publication No. 2003/0062149 to Goodson et al., the details of which are incorporated herein by reference, describes an electroosmotic microchannel cooling system.

There is a continuing need for improved materials for use in microchannel heat sinks to avoid some of the problems encountered with previously used materials. As will be recognized, the material from which the heat sink is formed (i.e., the substrate material) must be dimensionally stable so as to maintain its shape, yet it must also be leak-free, so the liquid coolant, under pressure, does not leak.

A dimensionally stable, leak-free graphite substrate can also be used in the formation of components for other applications, such as the flow field plates of electrochemical fuel cells. An electrochemical fuel cell such as an ion exchange membrane fuel cell, more specifically a proton exchange membrane (PEM) fuel cell, produces electricity through the chemical reaction of hydrogen and oxygen in the air. Within the fuel cell, electrodes, denoted as anode and cathode, surround a polymer electrolyte to form what is generally referred to as a membrane electrode assembly, or MEA. A catalyst material stimulates hydrogen molecules to split into hydrogen atoms and then, at the membrane, the atoms each split into a proton and an electron. The electrons are utilized as electrical energy. The protons migrate through the electrolyte and combine with oxygen and electrons to form water.

The MEA of a PEM fuel cell is sandwiched between two flow field plates. In operation, hydrogen flows through channels in one of the flow field plates to the anode, where the catalyst promotes its separation into hydrogen atoms and thereafter into protons that pass through the membrane and electrons that flow through an external load. Air flows through the channels in the other flow field plate to the cathode, where the oxygen in the air is separated into oxygen atoms, which join with the protons through the proton exchange membrane and the electrons through the circuit, and combine to form water. Since the membrane is an insulator, the electrons travel through an external circuit in which the electricity is utilized, and join with protons at the cathode.

The flow field plates are generally part of the structural support for the fuel cell, and thus have to be dimensionally stable. Also, since fluids like hydrogen, air and water flow about the channels formed along the surfaces of the plates, the plates need to be leak-free to avoid contamination or loss of reactants. Indeed, in some configurations, a cooling fluid flows between adjacent flow field plates, in which case having the plates leak-free is especially important.

Resin systems have been developed for the formation of dimensionally stable graphite sheets; resin systems have also been developed for the formation of leak-free graphite sheets. However, to date the production of graphite sheets, especially on which a pattern has been formed, which are both dimensionally stable and leak-free has not been possible. The formation of dimensionally stable sheets have led the formation of leak-paths through the sheets, while leak-free sheets have tended to be brittle and are therefore not dimensionally stable.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size, the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional such as thermal and electrical conductivity.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal conductivity due to orientation of the expanded graphite particles and graphite layers substantially parallel to the opposed faces of the sheet resulting from high compression, making it especially useful in heat spreading applications. Sheet material thus produced has excellent flexibility, good strength and a high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cc to about 2.0 g/cc.

The flexible graphite sheet material exhibits an appreciable degree of anisotropy due to the alignment of graphite particles parallel to the major opposed, parallel surfaces of the sheet, with the degree of anisotropy increasing upon compression of the sheet material to increase orientation. In compressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal and electrical properties of the sheet are very different, by orders of magnitude, for the "c" and "a" directions.

Accordingly, what is desired is a substrate for the formation of electronic thermal management articles, components of electrochemical fuel cells, or the like, where the substrate is formed of one or more sheets of compressed particles of exfoliated graphite, and which is both leak-free and dimensionally stable and yet is capable of having a pattern or structure formed thereon.

SUMMARY OF THE INVENTION

Accordingly it is an object of the present invention to provide a graphite material which is both dimensionally stable and leak-free.

Another object of the invention is to provide a substrate onto which a structure, such as a surface channel or groove, can be formed, while being dimensionally stable and leak-free.

Yet another object of the present invention is to provide a graphite substrate material which is inert to water and other conventional cooling liquids.

Still another object of the present invention is the provision of a substrate material formed of compressed particles of exfoliated graphite, which is dimensionally stable and leak-free, yet which can be formed using high volume manufacturing methods such as roller embossing, thus allowing cost effective manufacture of materials.

These objects and others which will be apparent to the skilled artisan upon reading the following description, can be achieved by providing a dimensionally stable leak-free substrate comprising a sheet of compressed particles of exfoliated graphite, the sheet having two major surfaces, and at least one of said major surfaces having a plurality of structures, such as channels or grooves formed thereon, the sheet having a first resin system impregnated through the thickness of the sheet and a second resin system coated on the surface of the sheet.

Advantageously, the first resin system is impregnated into the sheet prior to the formation of structures on the sheet whereas the second resin system is applied to the surface of the sheet after formation of structures thereon. The first resin system preferably comprises a thermosetting resin composition comprising an epoxy resin and/or one or more resins from the polybenzoxazine family containing single or multiple oxazine rings and the second resin system preferably comprises one or more heat curable polymerizable monofunctional and polyfunctional methacrylate resins, which are most preferably surfactant-free.

In another embodiment, the substrate includes a second sheet of compressed particles of exfoliated graphite, the first and second sheets being joined together to define fluid flow channels therebetween, each of the first and second sheets of compressed particles of exfoliated graphite comprising the first and second resin systems are detailed above.

In another embodiment of the invention, a method of manufacturing a substrate from graphite materials is provided. In the inventive method, a sheet of compressed particles of exfoliated graphite having two major surfaces is provided. A first resin system is impregnated into the sheet and at least partially cured. A structure such as a surface channel or groove is then formed on at least one of the major surfaces of the sheet, and a second resin system is then applied to the major surface on which the structure is formed, and thereafter cured.

It is to be understood that both the foregoing general description and the following detailed description provide embodiments of the invention and are intended to provide an overview or framework of understanding and nature and character of the invention as it is claimed.

DETAILED DESCRIPTION OF THE PREFERRED EMBODIMENT

The present invention provides a dimensionally stable, leak-free sheet of compressed particles of exfoliated graphite, having at least one structure formed thereon, the graphite sheet formed by a method which involves treatment with two distinct resin systems, as described herein. By "structure formed thereon" is meant that the surface of the sheet is treated or processed such that it is not flat, but, rather, has at least one surface feature such as a channel thereon or a groove therein. Such surface features can be formed by different methods which would be known to the skilled artisan, such as machining, embossing, molding, etc. By "dimensionally stable" is meant that the sheet is sufficiently robust in its essential characteristics to maintain its functionality in the environment in which it is intended to function. These characteristics may include glass transition temperature (Tg), Young's modulus, mechanical strength, thermal or electrical conductivity, and coefficient of thermal expansion (CTE). For instance, in a thermal management application, the inventive sheet needs to be able to maintain is essential shape and thermal conductivity under the conditions extant in the device in which it is located. By "leak-free" is meant that, when a surface area of one of the major surfaces of the sheet between about 10 $cm^2$ and about 500 $cm^2$ is exposed to a gas at a pressure of 7 pounds per square inch (psi)(0.05 megapascals (MPa)), the gas measured at the corresponding surface of the other major surface of the sheet is less than about 0.07 cc/min, more preferably less than about 0.03 cc/min. One apparatus for measuring leak rate involves two plates with an o-ring seal between them. The plates form an area that can be pressurized through a drilled port, which is connected to a gas source, such as a nitrogen source. By "resin system" is meant a resinous material, as would be understood by one skilled in the art, usually with a carrier fluid, like water or another solvent and, when required, a curing agent.

Graphite is a crystalline form of carbon comprising atoms covalently bonded in flat layered planes with weaker bonds between the planes. In obtaining source materials such as the above flexible sheets of graphite, particles of graphite, such as natural graphite flake, are typically treated with an intercalant of, e.g. a solution of sulfuric and nitric acid, where the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The expanded (otherwise referred to as exfoliated) graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact.

Graphite starting materials for the flexible sheets suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions, and the like. Natural graphite is most preferred.

The graphite starting materials for the flexible sheets used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has an ash content of less than twenty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed.

Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalated graphite flake with the organic reducing agent, the blend can be exposed to temperatures in the range of 25° to 125° C. to promote reaction of the reducing agent and intercalated graphite flake. The heating period is up to about 20 hours, with shorter heating periods, e.g., at least about 10 minutes, for higher temperatures in the above-noted range. Times of one-half hour or less, e.g., on the order of 10 to 25 minutes, can be employed at the higher temperatures.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower result in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calendar station conventionally used for compressing (or "calendering") graphite worms into flexible graphite sheet. The resulting sheet therefore has higher area weight uniformity and greater tensile strength, even when the starting graphite particles are smaller than conventionally used. The lubricious additive is preferably a long chain hydrocarbon. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compression molded together into flexible sheets having small transverse openings that, unlike the original graphite flakes, can be formed and cut into various shapes, as hereinafter described.

Alternatively, the flexible graphite sheets of the present invention may utilize particles of reground flexible graphite sheets rather than freshly expanded worms, as disclosed in U.S. Pat. No. 6,673,289, the disclosure of which is incorporated herein by reference. The sheets may be newly formed sheet material, recycled sheet material, scrap sheet material, or any other suitable source.

Also the processes of the present invention may use a blend of virgin materials and recycled materials, or all recycled materials.

The source material for recycled materials may be sheets or trimmed portions of sheets that have been compression molded as described above, or sheets that have been compressed with, for example, pre-calendering rolls. Furthermore, the source material may be sheets or trimmed portions of sheets that have been impregnated with resin, but not yet cured, or sheets or trimmed portions of sheets that have been impregnated with resin and cured. The source material may also be recycled flexible graphite PEM fuel cell components such as flow field plates or electrodes. Each of the various sources of graphite may be used as is or blended with natural graphite flakes.

Once the source material of flexible graphite sheets is available, it can then be comminuted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 mesh.

The size of the comminuted particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

Once the source material is comminuted, and any resin is removed if desired, it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into flexible sheets, as hereinbefore described.

Flexible graphite sheet and foil are coherent, with good handling strength, and are suitably compressed by, e.g. compression molding, to a thickness of about 0.025 mm to 3.75 mm and a typical density of about 0.1 to 1.5 grams per cubic centimeter (g/cc). Optionally, the graphite sheet may be impregnated with fibers and/or salts. Additionally, reactive or non-reactive additives may be employed with the resin system to modify properties (such as tack, material flow, hydrophobicity, etc.). The graphite sheet can be processed to change the void condition of the sheet. By void condition is meant the percentage of the sheet represented by voids, which are typically found in the form of entrapped air. Generally, this is accomplished by the application of pressure to the sheet (which also has the effect of densifying the sheet) so as to reduce the level of voids in the sheet, for instance in a calendar mill or platen press. Advantageously, the graphite sheet is densified to a density of at least about 1.3 g/cc (although impregnating with resin as discussed hereinbelow can reduce the voids without requiring densification to so high a level).

The void condition of the sheet can be used advantageously to control and adjust the morphology and functional characteristics of the final article. For instance, thermal and electrical conductivity, permeation rate and leaching characteristics can be affected and potentially controlled by controlling the void condition (and, usually, the density) of the sheet prior to the formation of structures thereon. Thus, if a set of desired characteristics of the final article is recognized prior to manipulation of the void condition, the void condition can be tailored to achieve those characteristics, to the extent possible.

Advantageously, especially when the final embossed article is intended for use as a component for an electronic thermal management device or in an electrochemical fuel cell, the graphite sheet is manipulated so as to be relatively void-free, to optimize electrical and thermal conductivities. Generally, this is accomplished by achieving a density of at least about 1.4 g/cc, more preferably at least about 1.6 g/cc (depending on resin content), indicating a relatively void-free condition. The thermal conductivity of the sheet is preferably at least about 140 W/m-K, more preferably at least about 400 W/m-K.

After formation of the graphite sheet, it is impregnated with a first resin system. This first resin system is a thermosetting resin system which advantageously comprises an epoxy and/or a polybenzoxazine compound. More preferably, the first resin system is a thermosetting polybenzoxazine resin or a mixture of polybenzoxazine and epoxy resin, which has a CTE of less than about 50 μm/m ° C. (defined as a z-axis linear CTE measured from the slope over temperature range ambient to the Tg), a Tg of at least about 110° C., and which does not require a separate curing agent, and is present in the graphite sheet at a level of at least about 5% by weight, more preferably about 10 to 35% by weight, and suitably up to about 60% by weight.

Resin impregnation into the sheet of compressed particles of exfoliated graphite may be effected by dipping or coating the sheet with the resin system, but is preferably effected by spraying the resin system on the graphite sheet and using a vacuum to then "pull" the resin through the sheet, as taught in U.S. Pat. No. 6,432,336, the disclosure of which is incorporated by reference herein.

While it is most desirable to have a uniform distribution of resin throughout the cross section of the graphite sheet, it is also possible to impregnate the graphite sheet with resin so that the sheet has a non-uniform, or variable, resin profile through the thickness of the sheet, as taught by U.S. Pat. No. 7,108,917, the disclosure of which is incorporated by reference herein. This can be accomplished in one of several ways, or by combinations of them. For instance, the resin concentration can be used to effect this non-uniform resin concentration. Thus, a more concentrated resin mixture can affect resin impregnation such that the resin concentration is higher in the sheet at the surface to which the resin is applied for impregnation. Similarly, the density of the sheet (or mat) to which the resin is applied can be manipulated; for example, a denser mat will cause the resin concentration to be higher in the sheet at the surface to which the resin is applied for impregnation. Likewise, control of the speed at which the sheet is moving through an impregnation apparatus or of the vacuum level used to pull the resin through the sheet can have the same effect.

By use of a non-uniform or variable resin profile in the sheet of compressed particles of exfoliated graphite, especially through the thickness of the sheet, complex shapes or structures can in certain circumstance be more easily formed on the surface of the sheet. This is due to the fact that a higher percentage of flowable resin is near the outside molding surface of the sheet, leading to a reduced requirement for pressure and/or temperature for flow and formation during the molding process. Moreover, with a higher percentage of flowable resin near the molding surface, cracking of the molding surface can be reduced.

Once the sheet is impregnated with the first resin system, the resin is at least partially cured, as taught by U.S. Patent Application Publication No. 20050189673, the disclosure of which is incorporated herein by reference, after which the sheet is surface treated to form one or more structures thereon. The degree of cure of the sheet prior to surface treatment should be that needed to reduce the tackiness of the resin sufficiently to facilitate the surface treatment process. Preferably, the resin should be at least about 45% cured, and more preferably at least about 65% cured, prior to surface treatment. In the most preferred embodiment, the resin is completely cured prior to the surface treatment. If only partially cured prior to surface treatment, cure of the first resin system in the sheet should be completed after the surface treatment is effected. The degree of resin cure can be measured by any means familiar to the skilled artisan. One method for doing so is by calorimetry, through which a residual heat of reaction value is obtained. For instance, if the resin formulation employed releases 400 Joules (J) per gram of material, and the calorimetric scan of the flexible graphite material measures 400 J, then it would be known that the resin was initially uncured. Likewise, if the scan measures 200 J, then the resin in the sample was 50% cured and if 0 J is measured, then it would be know that the resin formulation in the sample was completely cured.

By surface treating the sheet after curing of the resin, flow or movement of the graphite/resin composite can be reduced, and embossing of thinner materials may be possible. Most importantly, however, post-cure surface treating can reduce or eliminate the need for a non-stick or release coating, with concomitant gains in process efficiency (by not having to interrupt sheet production to reapply the coating) and reduction in process costs (by reducing or eliminating the cost of the non-stick or release coating).

Depending on the desired end use of the graphite sheet, whether electronic thermal management, such as in a heat sink, heat spreader or thermal interface, components for a flow-through capacitor, as described by Calarco et al. in U.S. Pat. No. 6,410,128, or fuel cell components such as a flow field plate, gas diffusion layer, or catalyst support, it is often necessary to form one or more structures on the surface of the sheet such as by embossing features on one or more surfaces of the sheet, such as channels. Different methods have been proposed for providing embossed features with improved feature definition (see, for instance, U.S. Pat. Nos. 6,604,457, 6,716,381 and 6,663,807; and International Publication No. WO 02/084760, the disclosures of which are incorporated by reference herein). Other methods can include machining, etching such as acid etching, air scribing, sonic machining, laser ablation, stamping, photolithography, and the like.

Once the formation of one or more structures on the surface of one or both major surfaces of the sheet of compressed particles of exfoliated graphite, a second resin system is applied to the sheet. The second resin system should have a viscosity sufficiently low to enable penetration into the pores on the surface of the sheet to which it is applied; more particularly, the second resin system should have a viscosity of no more than about 20 cps (measured at room temperature), when vacuum assisted impregnation is employed, as discussed above. More preferably, the viscosity of the second resin system should be no more than about 15 cps. When the second resin system is applied to the graphite sheet without resin assisted impregnation, the viscosity of the second resin system should be no more than about 5 cps.

The second resin system preferably comprises a heat curable sealant adhesive consisting of polymerizable monofunctional and polyfunctional methacrylates applied to the graphite sheet at a level of between about 0.05% to about 10% by weight, more preferably between about 0.2% and about 6% by weight. Advantageously, a free radical initiator is employed in the second resin system to facilitate crosslinking (i.e., cure) of the resin. One suitable free radical initiator is a substituted azonitrile compound, such as one available under the tradename Vazo from DuPont de Nemours Co. The free radical initiator can be present at a level of about 0.4% to about 1% by weight, and the sealed plates can be cured, e.g., at a temperature of about 170° C. or higher, in a hot water bath. Optionally, the second resin system can incorporate a dye, to provide the ability to observe effective resin coverage.

By the practice of the process of the present invention, a sheet formed of compressed particles of exfoliated graphite having one or more structures formed at a surface thereof can be made both dimensionally stable and leak-free, as compared to similar sheets prepared by prior art processes. While this application is written in terms of the use of such sheets to prepare microchannel heat sinks for cooling electronic device, flow-through capacitors or components for electrochemical fuel cells, it will be recognized that the inventive method and the dimensionally stable, leak-free sheet equally useful in other applications.

All cited patents and publications referred to in this application are incorporated by reference.

The invention thus being described, it will obvious that it may be varied in many ways. Such variations are not to be regarded as a departure from the spirit and scope of the present invention and all such modifications as would be obvious to one skilled in the art are intended to be included in the scope of the following claims.

What is claimed is:

1. A method for preparing resin-impregnated graphite articles, comprising:

a. providing a sheet of compressed particles of exfoliated graphite having two major surfaces;

b. impregnating the sheet with a first resin to form a resin-impregnated sheet;

c. surface treating the resin-impregnated sheet to form at least one structure on at least one of the major surfaces of the sheet to form a surface treated sheet; and d. treating the surface-treated sheet with a second resin.

2. The method of claim 1, wherein the first resin comprises a thermosetting resin impregnated into the sheet at a level of about 5% to about 35% by weight.

3. The method of claim 2, wherein the first resin comprises a resin selected from the group consisting of a polybenzoxazine resin, an epoxy resin and combinations thereof.

4. The method of claim 2, wherein the first resin is at least partially cured prior to surface treating of the resin-impregnated sheet.

5. The method of claim 4, wherein surface treating of the resin-impregnated sheet comprises embossing a channel along the surface of the resin-impregnated sheet.

6. The method of claim 1, wherein the second resin is applied to the surface treated sheet at a level of about 0.1% to about 9% by weight.

7. The method of claim 6, wherein the second resin comprises a methacrylate resin.

8. The method of claim 6, wherein the second resin comprises a dye.

9. The method of claim 7, wherein the methacrylate resin is applied to the surface treated sheet at a level of about 0.2% and about 6% by weight.

10. The method of claim 7, wherein the second resin further comprises a free radical initiator.

11. The method of claim 10, wherein the free radical initiator comprises a substituted azonitrile compound.

* * * * *